United States Patent [19]

Williams

[11] Patent Number: 4,670,748
[45] Date of Patent: Jun. 2, 1987

[54] PROGRAMMABLE CHIP SELECT DECODER

[75] Inventor: David G. Williams, Melbourne, Fla.

[73] Assignee: Harris Corporation, Melbourne, Fla.

[21] Appl. No.: 763,862

[22] Filed: Aug. 9, 1985

[51] Int. Cl.[4] .................... H04Q 9/00; G06F 1/00; H03K 19/096

[52] U.S. Cl. ...................... 340/825.84; 307/449; 340/825.22; 365/189

[58] Field of Search .............. 340/825.52, 825.54, 340/825.22, 825.83, 825.84; 307/449, 463, 465; 364/200; 371/8; 365/189, 230

[56] References Cited

U.S. PATENT DOCUMENTS

| | | |
|---|---|---|
| 4,389,715 | 6/1983 | Eaton, Jr. et al. ............... 371/8 |
| 4,422,072 | 12/1983 | Cavlan ........................... 340/825.83 |
| 4,477,739 | 10/1984 | Proebsting ..................... 307/449 |
| 4,493,029 | 1/1985 | Thierbach ...................... 364/200 |
| 4,504,904 | 3/1985 | Moore et al. .................. 307/465 |
| 4,520,463 | 5/1985 | Okumura ....................... 304/449 |
| 4,525,641 | 6/1985 | Cruz et al. ..................... 307/445 |
| 4,583,168 | 4/1986 | Pang et al. .................... 307/463 |

*Primary Examiner*—Donald J. Yusko
*Attorney, Agent, or Firm*—Thomas N. Twomey; Charles C. Krawczyk

[57] ABSTRACT

Programmable chip select decoder including a higher level of integration such that the entire chip select decoder circuitry is provided on a single integrated circuit to avoid the problems previously associated with multi-chip approaches. The CMOS implementation provides lower power yet provides higher speed than alternative implementations due to the optimized device architecture requiring minimum fuse programming.

32 Claims, 7 Drawing Figures

PROGRAMMABLE CHIP SELECT DECODER

FIELD OF THE INVENTION

The present invention relates generally to a programmable, high speed yet low power chip select decoder. More specifically, the present invention relates to a single chip programmable chip select decoder having a microprocessor bus oriented interface compatible at both input and output with TTL and CMOS and providing CMOS power consumption at faster operating speeds than obtainable with low power Schottky devices.

BACKGROUND

With the advent of computers a need arose for the computer to communicate with peripherals such as memory, RAM's, PROM's, I/O peripherals, timers, interrupt controllers, etc. In order to control the access by the computer to the peripheral it was necessary to activate a fixed connection between the computer and the peripheral using intervening discrete logic. This was the common control mechanism for accessing peripherals until the advent of microprocessors. As IC's became common in computers, the discrete logic functions needed for accessing peripherals was moved from discrete logic to PROM's, then PLA's and PAL's which provide general programmable logic capability which was programmed for the discrete logic functions but because of the limited number of inputs were unable to provide sufficient decoding capability. As the number of inputs increase, the size of a PROM able to handle the decoding task increases exponentially thus rendering PROMs impractical. For instance, when 11 inputs are needed, a 2K word PROM was needed and each fuse required specific programming. Since a chip controller function ordinarily requires only about 10% of the available logic in a 2K PROM, PLA, or PAL, the remainder of the device is wasted.

For a PLA or PROM, up to 4,000 fuses, or other memory cells are included and the normal application would involve the programming of only up to about 300 memory elements with the remainder being excessive. However, it is necessary to render many of the remainder of the memory elements inoperative in order to prevent erroneous operation of the device. Additionally, due to the general nature of a PAL, it is necessary in some instances to establish an output function tailored to the chip select function requiring the programming of up to 300 memory elements. Of the remaining memory elements in the general purpose programmable logic devices, it is typically necessary to use only 10% of the memory to implement the chip select function. Thus, a substantial portion of the available logic goes unused.

An example of a current chip select implementation for a microprocessor is shown in FIG. 1 where a CPU which may be for example, an 80C86 microprocessor, will provide as an output (input to the chip select decode circuitry) address, data and control signals. These signals are received by 74HC373 latches which demultiplex the address and control information from the multiplexed bus to provide the address information to programmable inversion devices, shown here as 7 position DIP switches which in conjunction with the inverters 74HC04 establishes proper polarity of the address inputs. The address information is logically AND'ed with control signals to perform the appropriate chip select. This logic function is performed by the dual 2 to 4 line decoder. An AND function is provided for the purpose of reducing the number of lines provided to the line decoder. The output from the line decoder selects the peripheral device which the CPU intends to access.

In operation, the time required from the CPU's issuance of the command signal until the chip select decoder circuitry implements the command can be as high as 220 ns as specified in the data sheets for the above part types. Additionally, the power consumption of this CMOS implementation could typically be about 50-75 mw.

In situations where speed and reliability are more important, an alternative approach is illustrated in FIG. 2 utilizing commercially available bipolar logic devices. The address/data signals provided to the multiplexed bus by the CPU are received by the address latch 74ALS373 which strips off the address information from the multiplexed data bus and passes the address information to the Programmable Logic Device, shown as a 12L10. Control signals are also provided to the 12L10. The Programmable Logic Device is programmed to provide, as its output, a decoded chip select signal. This arrangement would typically require up to 125 ma (625 mw) and can provide access to the peripheral within 64 ns after the CPU's issuance of the command signal.

Activation of a peripheral device generally involves the provision of a first logic level to a device select input of the peripheral device. Deactivation of the peripheral device occurs whenever a second logic level signal is provided to its device select input. Upon activation, the peripheral device receives the data portion of the multiplexed signal on the multiplexed bus which data controls the operations of the peripheral.

The various approaches to implementing a chip select function are not uniformly acceptable due to either too slow an access time as with the embodiment of FIG. 1 or too great a power requirement as in the embodiment of FIG. 2. Additionally, the plurality of individual chips required to implement these approaches increases the risk of defective soldering of the chips to the circuit board, defective packaging, or defective board performance. Thus, if the the desired functions could be performed with increased speed, reduced power and on a single chip, the drawbacks associated with the existing alternatives could be overcome.

For purposes of demonstrating the inefficiencies associated with the use of existing approaches, the implementation of a chip select function utilizing a 12L10 is described. This approach is currently believed to be among the best available alternatives for a product designer. A 12L10 includes approximately 500 fuses only about 200 of which need to be programmed to perform a chip select decoder function. Thus, about 300 fuses are wasted in this example. The cost, in terms of final manufacturing yield, and costs associated with the extra circuit size required to provide an extra 300 fuses, could be avoided if an optimized programmable chip select decoder could be provided. Additionally, in the programming of a 12L10 for a chip select decoder function, it is necessary to program a significantly greater number of fuses than are actually used in the chip select decoder operation. This is required in order to insure that the unused fuses do not result in undesired operation. Thus, these extra fuses are rendered inactive by positively programming them out of the system. Thus, if a more efficient circuit architecture were provided, the programming of an excessive number of fuses could be avoided.

SUMMARY OF THE INVENTION

The present invention addresses the existing need for a high-speed, low power programmable chip select decoder on a single chip.

It is an object of the present invention to provide an inexpensive and highly reliable programmable chip select decoder by including the entire chip select decoder function and the means for conveniently programming the chip select decoder on a single chip.

It is also an object of the present invention to provide a chip architecture which is efficient for implementing a programmable chip select decoder function on a single chip.

Another object of the present invention is to simplify the task of programming a programmable chip select decoder and to obviate the need to program a general purpose logic device for the specific chip select decoder function.

An additional object of the present invention is to provide as a standard semiconductor chip, a programmable chip select decoder having a greatly reduced need for programming due to the application, specific design and architecture of the invention.

These and other objects of the invention are met by the present invention as described herein.

The programmable logic devices of the present invention are application specific for the chip select decoding function normally required in microprocessor or computer based systems. The higher level of integration provides a single integrated circuit capable of avoiding the problems previously associated with multi-chip approaches. The CMOS implementation provides substantially lower power consumption than available from any alternatives, yet does not require the slower speed of prior CMOS implementations. This is made possible through the use of an optimum device architecture which requires only two fuses for each programmable input thereby avoiding the previously common waste of logic capability.

In operation, the multiplexed address/data and control signals on the multiplexed bus are provided to the transparent input latches which include low bank select, address input, latch control, high bank select and programmable address inputs. The ALE is provided with the control signal provided by the CPU and is used to facilitate the stripping of the address information from the bus. The multiplexed data/address inputs are provided to the programmable address inputs and the transparent latch under control of the ALE control signal, strips the address information from the bus and provides the address information to a programmable comparator. The output of the programmable comparator is a global enable for the chip select outputs and a MATCH for wait-state control or bus arbitration.

The two additional address inputs select one of four outputs in a fixed decode operation while the low bank and high bank inputs select neither, of the banks or either one or both of the banks. The fast output select is also provided in parallel with the other 3 select functions thus enabling the programmer to provide 12 possible outputs and an all off condition for 13 total possible outputs. This final position is important for the common situation where more than one programmable chip select decoder is included in a circuit and where only one is operating to select a peripheral chip.

DETAILED DESCRIPTION OF THE INVENTION

The present invention relates to a programmable chip select decoder including an architecture which provides greatly increased efficiency relative to previous implementations. The architecture of the programmable chip select decoder of the present invention permits a convenient one-chip embodiment which can be programmed with a minimum requirement for fuse programming.

Figure 3:
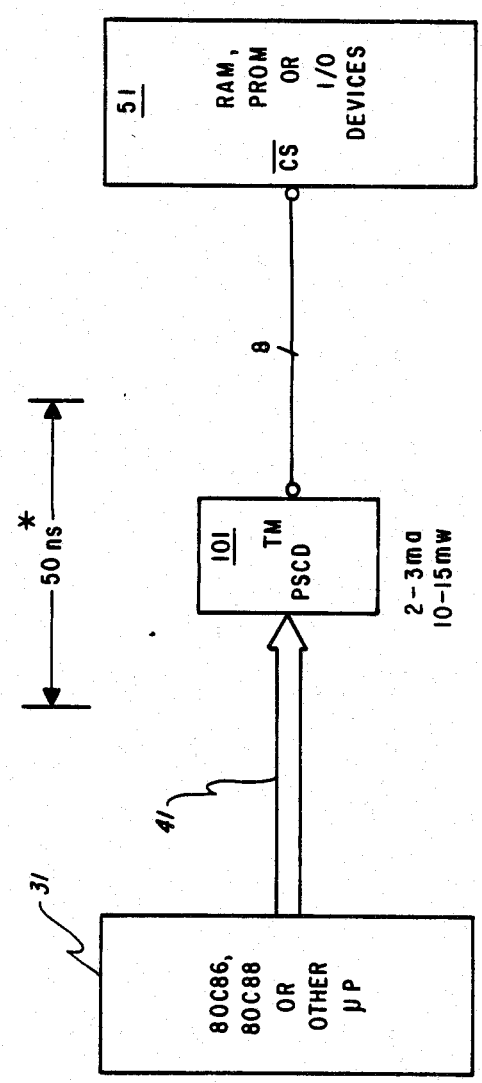
FIG. 3 is a block diagram of the programmable chip select decoder of the present invention showing its relationship to the processor and peripheral devices.

A block diagram of the programmable chip select decoder in provided in FIG. 3 where a processor 31, shown as a CMOS microprocessor, designated an 80C86, provides, as a command signal, a multiplexed address/data and control output signals on multiplexed bus 41. The programmable chip select decoder 101 receives the multiplexed output signal, detects the control and address signals from the multiplexed signal, decodes the address signals and provides a chip select output signal to thereby establish a communication path from the microprocessor 31 to one of the peripheral chips 51.

The general operation of the programmable chip select decoder of the invention differs from the operation of previously available techniques for chip select decoding. The invention provides circuitry in the programmable chip select decoder which can receive a multiplexed signal and separate the address command portion of the signal from the remainder and in real time, compare the address signal with the programmed address code which has been set by the programmer, and provide an output to designate the peripheral chip, or device, to which the processor is to be connected. The term "address command" refers to the signal provided by the processor to identify a particular peripheral device, such as remote memory or an input/output device.

Figure 4:
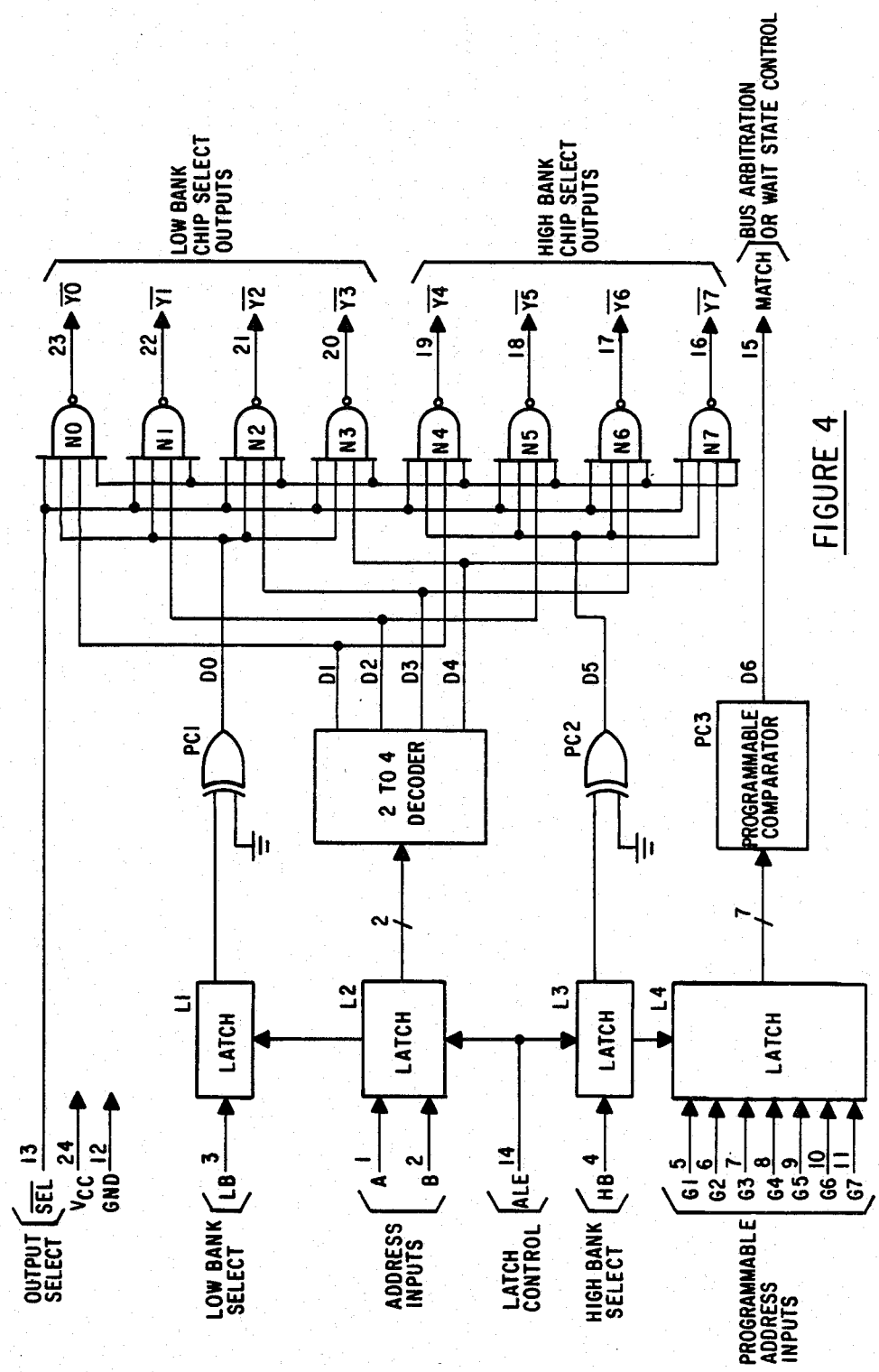
FIG. 4 is a schematic diagram of the programmable chip select decoder of the invention showing the general architecture of a preferred embodiment.

A more detailed illustration of the functional blocks of the invention is shown in FIG. 4. Input terminals SEL, LB, A, B, ALE, HB, and $G_1$–$G_7$, are shown and their internal connections are also illustrated. A fast output select terminal SEL is provided to allow receipt of an output select signal, the receipt of which indicates that the address signal is at a stable level as opposed to being in transition from a prior address to a successive address. This terminal provides the received output select signal to one input of each of the logic elements $Y_0$-$Y_7$.

A latch control terminal ALE is provided to allow receipt of control commands from the processor and to provide an enable signal to latches $L_1$-$L_4$ when an address signal is present on the address input terminals LB, HB, A, B, and $G_1$-$G_7$. Upon receipt of the enable signal from the ALE inputs to be passed to their outputs.

The outputs of latches $L_1$, $L_3$ and $L_4$ are provided to a programmable comparator PC which includes $PC_1$, a one bit, independently programmable comparator which may be programmed by blowing a single fuse. The programmable comparator PC includes a second one bit fuse programmable comparator $PC_2$ and a seven bit fuse programmable comparator $PC_3$ wherein each bit may be independently programmed. It is noted that $PC_3$ could be a group of seven single bit programmable comparators. The programmable comparator as illustrated here also includes a two to four decoder which is a non-programmable element of the comparator stage which element receives its two bit input from latch $L_2$.

In the implementation shown, comparator $PC_1$ has a one bit output which will be true when the input from latch $L_1$ equals the logic level programmed into the one bit comparator $PC_1$. The LB input receives a single bit of the address signal, this address bit providing either a low bit or a not low bit indication. If the logic level of the LB input signal results in a true output from $PC_1$, the low bank chip select output logic devices $N_o$-$N_3$ will each receive a true input on one of their inputs. Alternatively, if the low bank select input signal does not result in a true output from $PC_1$, each of the low bank chip select output logic devices $N_o$-$N_3$ will receive a false input on one of their inputs.

The high bank select input signal is provided to $PC_2$ and the operation, similar to the $PC_1$ operation, will result in either true or false inputs to one input of each of the high bank select output logic devices $N_4$-$N_7$.

Input terminals A and B are operative to provide two address bits, through latch $L_2$, to the two inputs of the two-to-four decoder. Each of the four outputs $D_1$-$D_4$ are provided to an input of one high bank and one low bank chip select output logic device. For instance, as shown, the output line $D_1$ is connected to one input of both $N_o$ and $N_4$ while the output line $D_2$ is connected to $N_1$ and $N_5$.

An additional input to each of $N_o$-$N_7$ is provided from the output of $PC_3$ on line $D_6$. Thus, since the signal on line $D_6$ is provided as an input to each of $N_o$-$N_7$, a false input on line $D_6$ can cause all outputs $Y_o$-$Y_7$ to be false if logic devices $N_o$-$N_7$ are AND gates. Similarly, when the digital signal level provided to the fast output select signal SEL causes a false logic level to be provided to $N_o$-$N_7$ the outputs $Y_o$-$Y_7$ are all false such that none of the output devices are activated.

The operation of programmable comparator segment $PC_3$ provides a match signal or match output indicative of the selection of the programmable chip select decoder by the processor. This initial determination that the processor has issued a command intended for this programmable chip select decoder is necessary to insure that only the desired peripherals are activated in response to a processor command. In many applications there will be more than one chip select decoder, thus making it important that a mechanism exist for the processor to separately address an individual chip select decoder and to avoid addressing any other chip select decoder. Since only one chip select decoder will be accessed, only one peripheral will be accessed by the single access command provided. In order to insure that the programmable chip select decoder does not provide an active signal to a peripheral, except when the decoder is the decoder selected by the processor, the seven match bits $G_1$-$G_7$ must correspond with the seven programmed bits in $PC_3$. Otherwise a false input is provided to each of $N_o$-$N_7$, thus causing all chip select output signals $Y_o$-$Y_7$ to be deactivated signals.

In parallel with the outputs $Y_0$-$Y_7$ a separate match output MATCH is provided to insure that the outputs $Y_o$-$Y_7$ are provided to the bus. This signal can be used for wait-state generation and/or for bus arbitration either or both of which can be accomplished when a true output to a selected peripheral is provided. Otherwise, when the MATCH output is false, the false signal indicates that outputs $Y_0$-$Y_7$ are in an inactive state and that their outputs need not be provided to the bus. The MATCH output provides feedback to the microprocessor to confirm that one of $Y_0$-$Y_7$ is active. When the peripheral chip which has been selected is a slow device, that is, not able to execute its operation in the normal operating cycle of the microprocessor, the microprocessor will initiate a "wait-state" to allow the peripheral to complete its operation. For instance, in an 80C86 microprocessor made by Harris Corporation, each wait-state causes the bus cycle to be extended by 25% of a normal bus cycle. Since the match signal is provided whenever any peripheral on a given programmable chip select decoder is accessed, the wait-state will be implemented every time any peripheral is accessed. In those instances where some peripherals can complete their operation in a normal bus cycle, while other peripherals require a wait-state, it is possible to utilize more than one PCSD, appropriately programmed and connected so as to call for a wiat-state only when a slow peripheral is accessed.

Figure 5:
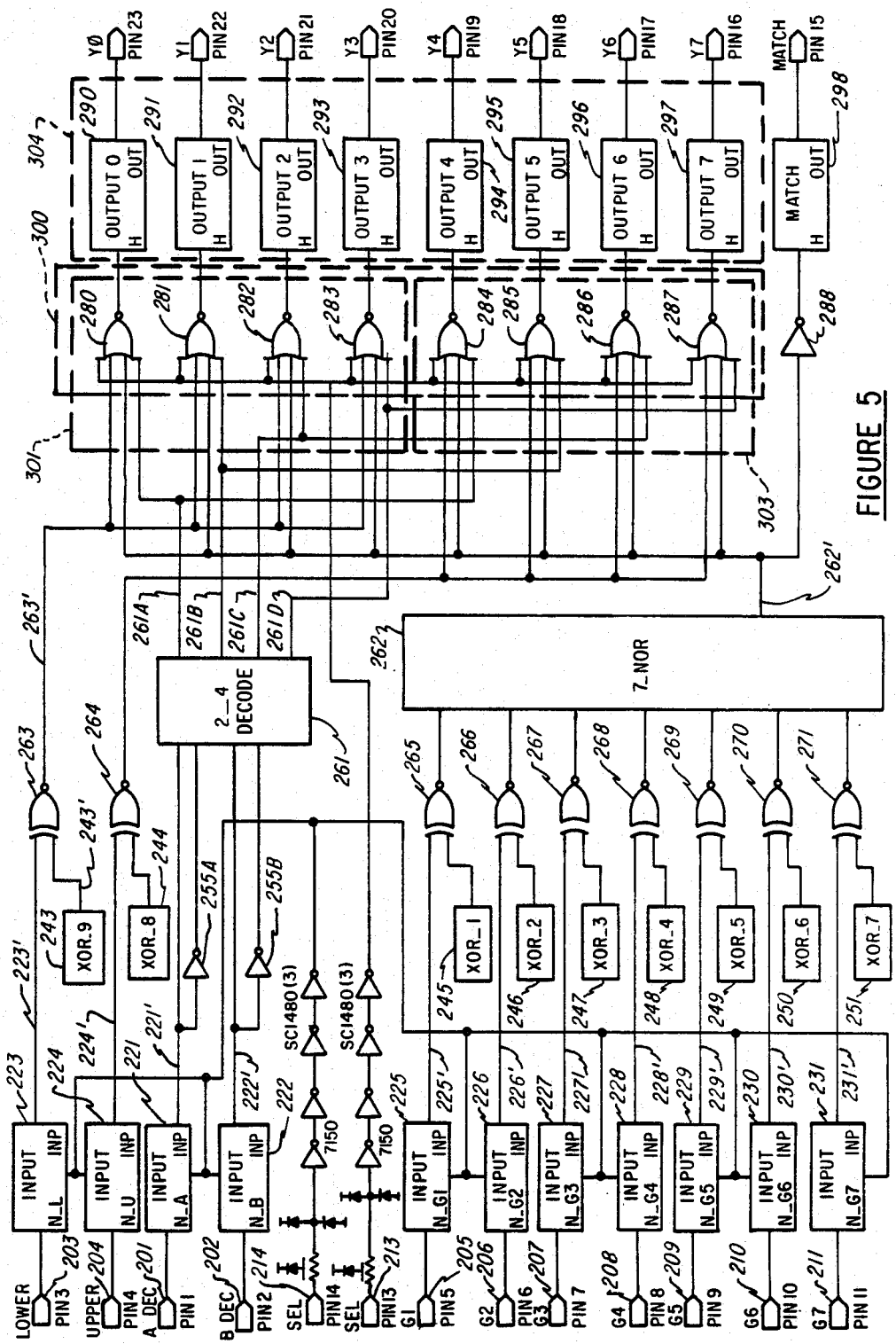
FIG. 5 is a schematic diagram of the programmable chip select decoder of the invention providing further details of a preferred embodiment.

A more detailed circuit arrangement is illustrated in FIG. 5 wherein a preferred manner of implementing the invention is disclosed. In this embodiment a programmable input stage is provided to permit programming of the programmable chip select decoder for either high true or low true logic. This is accomplished by providing an individually programmable invert/non-invert function which may be in cooperation with the input latch function.

Input terminals 201 and 202 are connected respectively to input blocks 221 and 222 which provide a gated transparent latch function in response to the receipt of a latch enable signal via line 215. These input blocks 221,222 may accept either high-true logic or low-true logic and provide as outputs on line 221' and 222' the same logic level as provided on the input. In similar fashion, each of input terminals 203–211 are connected to an input block 223–231 and each input block 223–231 can provide a gated transparent latch function. Again, the enabling of the transparent latches is controlled by the presence of a latch enable signal on line 215.

Input terminal 214 is connected to an input buffer $214_a$ and $214_b$ such that upon receipt of the high clock signal from the bus to which terminal 214 is connected, a high signal will be provided on line 215.

Figure 6:
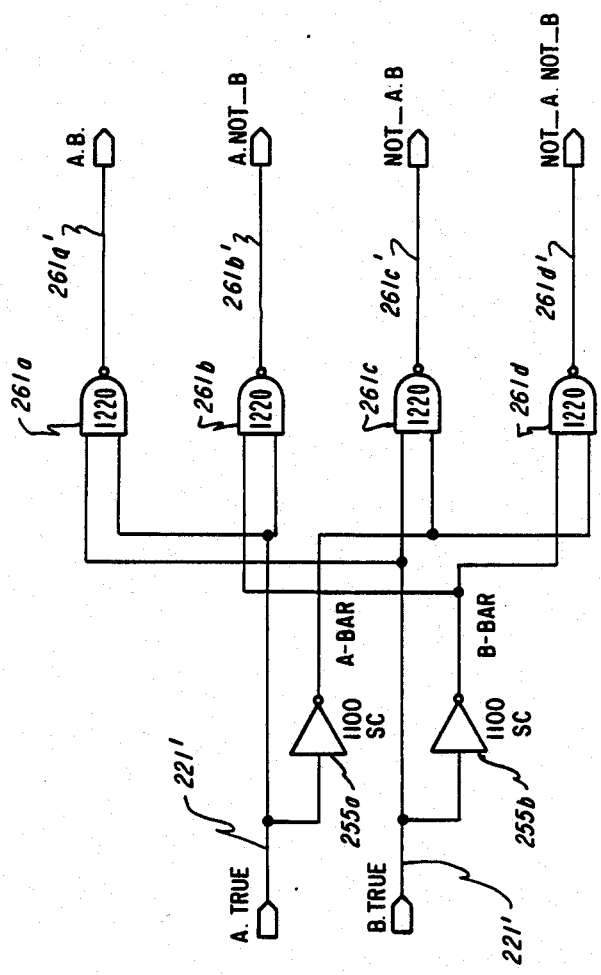
FIG. 6 is a schematic diagram of a specific implementation of the two-to-four decoder illustrated in block form in FIG. 5.

The signals provided on lines 221', 222' are provided to the inputs of two-to-four decoder 261. Inverters 255$_a$, 255$_b$ receive the signals provided on lines 221', 222' and provide inverted signal to the inputs of two-to-four decoder 261. As shown in FIG. 6, the use of the inverters 255$_a$, 255$_b$ permits the use of a very simple two-to-four decoder with the logic elements and truth table values shown in FIG. 6. NAND gates 261$_{a-d}$ each provide one of the possible outputs. Due to the mutual exclusivity of the logic function, only one of outputs 261$_a$', 261$_b$', 261$_c$' or 261$_d$' will be true and the remaining three will be false.

Referring again to FIG. 5, the outputs from two-to-four decoder 261 is provided to the array 300 of logic elements 280–287. In the implementation shown, each of output lines 261$_a$'–261$_d$' are provided to two of the logic elements 280–287, one from the low bank 301 and one from the high bank 303. For instance, the output on line 261$_a^1$ is provided to an input of each of logic devices 280 and 284 while the output on line 261$_b$' is provided to an input of each of logic devices 281 and 285. The two remaining outputs of decoder 261 are provided via lines 261$_c$' and 261$_d$' to inputs of logic devices 282, 283, 286 and 287 as shown.

The logic devices 280–287 are illustrated as NOR gates but the logic function required at this stage could be equally performed by AND gates or other logic combination, the significance being that a true output is provided only when all inputs are true. Thus, the logic array 300, in combination with output buffers 304, shown here as inverting output buffers 290–297, will provide a true output on a particular output Y$_0$–Y$_7$ only if all inputs to the logic element 280–287 are true.

Returning to the remaining address inputs 203–211, the programmable aspects of the embodiment of FIG. 5 will be explained. Input terminal 203 is connected to input block 223 which provides a gated transparent latch function under control of the latch enable signal provided via line 215. When the latch enable signal is in an enable state, that is when the logic value on input terminal 214 is high, the logic value on input terminal 203 is passed through the transparent latch 223 and provided to logic element 263 via line 223'. Thus, if a true logic signal is provided to input terminal 203, a true logic signal will be provided to one input of logic element 263 when the latch enable signal on line 215 is high. The latch function provided by latch 223 will result in holding an existing output during periods when the latch enable signal on line 15 is low. A second input is provided to logic element 263 from the programmable element 243. In the present example, element 243 comprises a fuse programmable single bit circuit capable of being programmed to provide either an active high or an active low output via line 243' to a second input of the logic element 243. In this manner, the fuse programmable single bit circuit will provide control of whether the signal on line 223' is inverted by the logic element 263. If the signal is to be inverted, an initially low input will provide a high output and for an initially high input a low output will be provided. This invert function which is present in logic elements 263–271 permits the programmable chip select decoder to be programmed to accept either high-true logic or low-true logic and to be converted to high true logic at the output of logic elements 263–271. For instance, when the address signal received on terminals 201–211 is high true logic, the programmable elements 243–251 are programmed to maintain high-true logic. However, if low true logic is desired, the inverting capability obtained by programming elements 243–251 to provide low true logic will result in a high true logic output from elements 263–271.

Similar programmability of the inputs to each of terminals 204–211 is provided by gated transparent input latches 224–231, programmable elements 244–251 and logic elements 264–271.

The output signal provided from logic element 263 is provided via line 263' to an input of each of logic elements 280–283 which make up the low bank portion 301 of logic array 300. Thus, upon provision of a true signal on line 263', each of logic elements 280–283 will receive a true input on its low bank select input terminal.

The output signal provided from logic element 264 is the high bank select signal and is provided in similar fashion to the high bank select portion 303 of logic array 300. Thus, the provision of a high bank select signal to input terminal 204 will result in the provision of a true signal to one input to each of logic elements 284–287.

With respect to address input terminals 205–211, the signals received at terminals 205–211 are provided to an associated gated input latch 225–231 similar to gated transparent input latch 223 associated with input terminal 203. Also, logic elements 265–271 and programmable elements 245–251 provide comparator functions for the inputs received from latches 225–231. The output of each of the logic elements 265–271 are provided to logic array 262 which in this instance is a seven input NOR circuit. The function of this circuit is to provide a match signal as an output on line 262' when all inputs are true. Thus, when each of the seven input signals to logic elements 265–271 match the logic level programmed into the individually programmable elements 245–251 the output on line 262' will be true. This match output is provided to an input of each logic element 280–287 in logic array 300. Additionally, the match signal is also provided to output buffer 298 to a match output terminal MATCH. Output buffers 290–297 are also inverting output buffers, thus the particular logic elements selected for logic elements 280–287 are inverting logic devices, or NOR gates in this example. Thus, the AND array 300 is actually implemented such that the output is inverted.

In this implementation, the outputs provided on chip select output terminals Y$_0$–Y$_7$ will be consistent with the truth table shown below. As is evident, the fast output select input terminal 213 provides a one bit control of an output enable function. Thus, when the SEL input is true there is a true input provided to each logic element 280–287 of the logic array 300. Alternatively, when a false input is provided to terminal 213 all address outputs will be false.

| INPUTS | | | | | OUTPUTS | | | | | | | |
|---|---|---|---|---|---|---|---|---|---|---|---|---|
| A | B | SEL | LB | HB | G$_1$–G$_7$ | Y$_0$ | Y$_1$ | Y$_2$ | Y$_3$ | Y$_4$ | Y$_5$ | Y$_6$ | Y$_7$ |
| 0 | 0 | 0 | T | F | T | F | T | T | T | T | T | T | T |
| 1 | 0 | 0 | T | F | T | T | F | T | T | T | T | T | T |
| 0 | 1 | 0 | T | F | T | T | T | F | T | T | T | T | T |
| 1 | 1 | 0 | T | F | T | T | T | T | F | T | T | T | T |
| 0 | 0 | 0 | F | T | T | T | T | T | T | F | T | T | T |
| 1 | 0 | 0 | F | T | T | T | T | T | T | T | F | T | T |
| 0 | 1 | 0 | F | T | T | T | T | T | T | T | T | F | T |
| 1 | 1 | 0 | F | T | T | T | T | T | T | T | T | T | F |
| 0 | 0 | 0 | T | T | T | F | T | T | F | T | T | T | T |
| 1 | 0 | 0 | T | T | T | T | F | T | T | F | T | T | T |
| 0 | 1 | 0 | T | T | T | T | T | F | T | T | F | T | T |
| 1 | 1 | 0 | T | T | T | T | T | T | F | T | T | T | F |

-continued

| INPUTS | | | | | OUTPUTS | | | | | | | |
|---|---|---|---|---|---|---|---|---|---|---|---|---|
| A B | SEL | LB | HB | $G_1$-$G_7$ | $Y_0$ | $Y_1$ | $Y_2$ | $Y_3$ | $Y_4$ | $Y_5$ | $Y_6$ | $Y_7$ |
| X X | 1 | X | X | X | T | T | T | T | T | T | T | T |
| X X | X | X | X | F* | T | T | T | T | T | T | T | T |
| X X | X | F | F | X | T | T | T | T | T | T | T | T |

Figure 7:
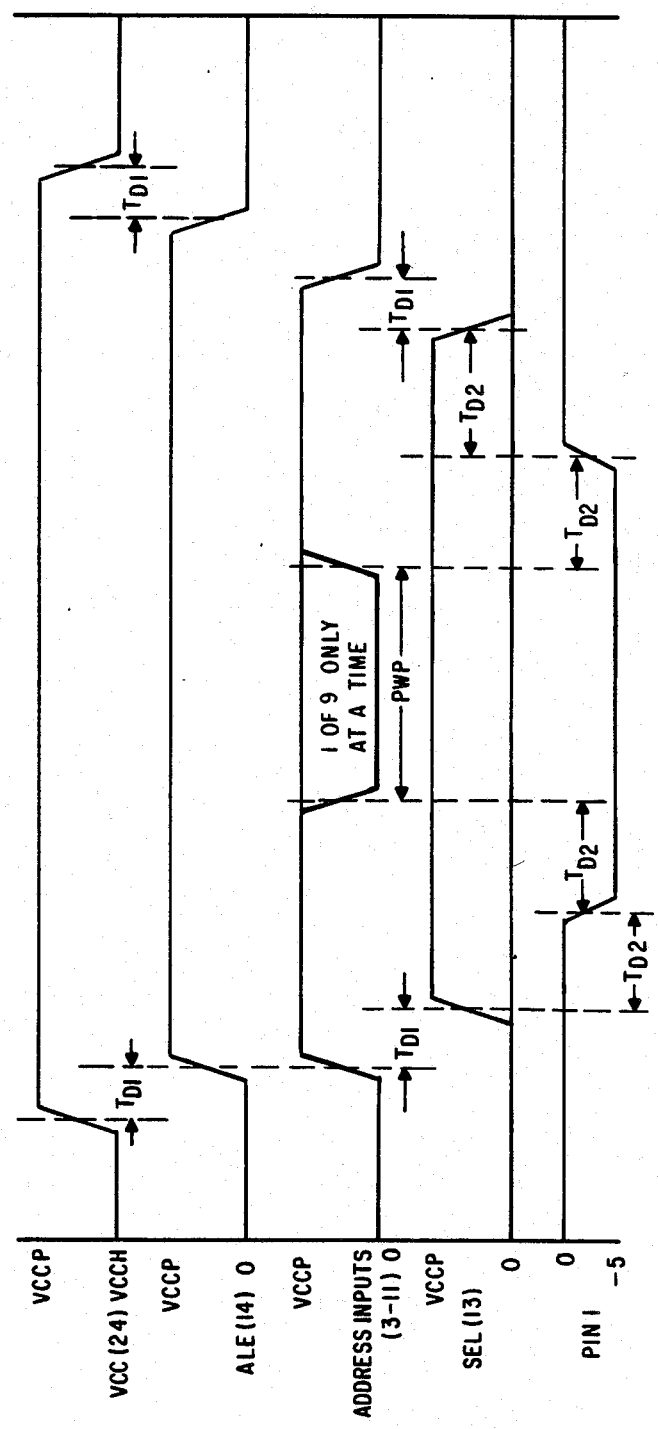
FIG. 7 is a timing diagram showing the various operational steps of the programmable chip select decoder of the invention in timed relation to other chip operations.

If SEL is high all outputs will be high. If any one of the 7 G inputs is false then all outputs will be high. The match output will be true when all 7 G inputs are true.
0 Low On Input
1 High On Input
H High On Output
L Low On Output
T True Input (User Programmable)
F False Input (User Programmable)
X Don't Care
*One or more false The fast output select signal SEL serves the purpose of insuring that the chip select decoder output signal at terminals $Y_0$-$Y_7$ is provided at the appropriate time to the selected peripheral. The timing of the signals is represented on FIG. 7.

Figure 1:
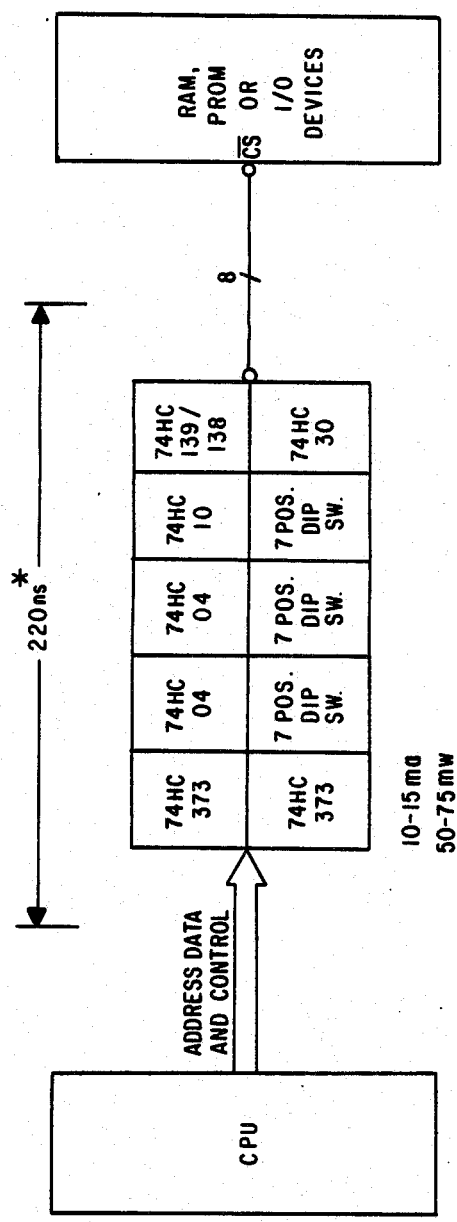
FIG. 1 is a block diagram of a CMOS version of a typical programmable chip select implementation.
Figure 2:
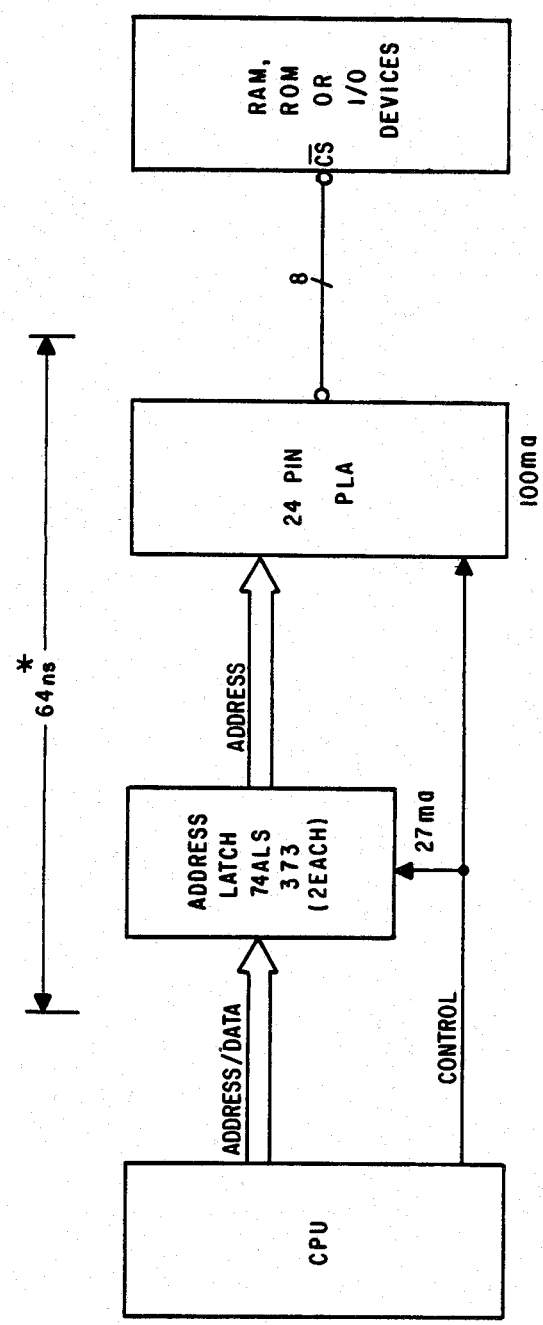
FIG. 2 is a block diagram of a bipolar version of a typical programmable chip select implementation.

The architecture of this device permits completion of the chip select decoder function is less than 50 ns under unfavorable conditions following the issuance of the chip select command by the processor. However, under favorable conditions such as a 25° C. ambient temperature and a 5.00 volt power supply, typical chip select operation is completed within about 22 ns. This compares very favorably with the 64 ns and 220 ns achievable with the previous approaches as shown in FIGS. 1 and 2. Additionally, the efficient architecture of the invention provides operation at less than 15 mw and a current of only 2-3 ma while the prior art approaches require typically 125 ma and 625 mw for the 64 ns operation or in the lower power, but slower operation, 10-15 ma and 50-75 mw.

This power and speed savings is of great significance to a product manufacturer. Since the cost of peripheral devices increases substantially as their speeds increase, the speed improvement in the chip select decoder will permit the use of slower and hence less expensive peripherals. From a system design perspective where, for instance, three chip select decoders are required with each providing access to 8 peripherals, it would be possible to purchase 24 slower peripherals yet achieve equally fast system operation. The savings associated with the purchase of slower peripherals will in many instances exceed the total cost of the programmable chip select decoders.

From the preceding description of the preferred embodiments it is evident that the objects of the invention are attained, and although the invention has been described and illustrated in detail, it is to be clearly understood that the same is by way of illustration and example only and is not meant to be taken by way of limitation. It is intended that the following claims shall be interpreted in accordance with the full scope of the underlying invention including any and all variations thereof which might be suggested or obvious to those skilled in the semiconductor arts.

What is claimed is:

1. A programmable chip select decoder on a single integrated circuit consisting essentially of:
    means for receiving a multiplexed signal from a multiplexed bus said signal including a multibit address signal;
    means for demultiplexing said multiplexed signal to obtain said address signal;
    means for receiving and storing a programmed code;
    means for comparing said address signal with said programmed code comprising a non-programmable decoder means to which is provided at least two bits of said address signal; and
    means for providing a chip select output signal comprising a non-programmable array of logic elements.

2. A programmable chip select decoder as claimed in claim 1 wherein;
    said means for demultiplexing comprises transparent input latches.

3. A programmable chip select decoder as claimed in claim 1 further comprising:
    means for holding said address signal.

4. A programmable chip select decoder as claimed in claim 1 wherein:
    said means for receiving and storing said programmed code comprises a fuse programmable digital comparator.

5. A programmable chip select decoder as claimed in claim 4 wherein:
    said fuse programmable digital comparator includes a fixed decoder portion; and
    said fuse programmable digital comparator may be fully programmed upon the blowing of n fewer fuses than the number of bits in said address signal where n in the number of address bits provided to said fixed decoder portion.

6. A programmable chip select decoder on a single integrated circuit comprising:
    means for receiving a multiplexed signal from a multiplexed bus said signal including a multibit address signal,
    means for demultiplexing said multiplexed signal to obtain said address signal,
    means for receiving and storing a programmed code comprising a fuse programmable digital comparator that requires the blowing of N-2 fuses for an address signal having N bits;
    means for comparing said address signal with said programmed code; and
    means for providing a chip select output signal.

7. A programmable chip select decoder as claimed in claim 6 wherein:
    said means for comparing said address signal with said programmed code includes a non-programmable decoder means to which is provided two bits of said address signal.

8. A programmable chip select decoder as claimed in claim 7 wherein:
    said means for comparing said address signal with said programmed code includes a low bank select decoder to which is provided one bit of said address signal.

9. A programmable chip select decoder as claimed in claim 6 wherein:
    said means for comparing said address signal with said programmed code includes a low bank select decoder to which is provided one bit of said address signal.

10. A programmable chip select decoder as claimed in claim 6 wherein:
    said means for providing a chip select output signal comprises a non-programmable array of logic elements.

11. A programmable chip select decoder as claimed in claim 1 wherein:

said means for receiving and storing said programmed code comprises a fuse programmable digital comparator.

12. A programmable chip select decoder as claimed in claim 5 wherein:
said means for providing a chip select output signal comprises a non-programmable array of logic elements.

13. A programable chip select decoder as claimed in claim 5 wherein:
said means for comparing said address signal with said programmed code includes a non-programmable decoder means to which is provided at least two bits of said address signal.

14. A programmable chip select decoder as claimed in claim 7 wherein:
said means for providing a chip select output signal comprises a non-programmable array of logic elements.

15. A programmable chip select decoder as claimed in claim 10 further comprising:
means for providing an inactive output state during an address transition period.

16. A programmable chip select decoder on a single integrated circuit comprising:
means for receiving a multiplexed signal from a multiplexed bus said signal including a multibit address signal,
means for demultiplexing said multiplexed signal to obtain said address signal,
means for receiving and storing a programmed code;
means for providing a chip select output signal comprising a non-programmable array of logic elements; and
means for providing a match output for use in wait state generation and bus arbitration.

17. A programmable chip select decoder as claimed in claim 16 further comprising:
means for providing an inactive output state during an address transition period.

18. A programmable chip select decoder on a single integrated circuit adapted for direct connection to a multiplex bus carrying multiplexed data, control and address signals, comprising:
a plurality of input terminals;
a plurality of transparent input latches connected to a first set of input terminals, each input terminal in said first set of input terminals corresponding to an individually associated bit of a multibit address signal;
a plurality of single bit programmable digital comparators, each of said single bit programmable digital comparators being associated with a distinct input terminal of said first set of input terminals and having an individual comparator output;
a second set of input terminals, each input terminal in said second set of input terminals corresponding to an individually associated bit of said multibit address signal;
a non-programmable decoder having one input dedicated to each input terminal in said second set of input terminals and a plurality of non-programmable decoder outputs;
a third set of input terminals, each input terminal in said third set of input terminals corresponding to an individually associated match bit of said multibit address signal;
a programmable match comparator having an individual input connected to each of said input terminals in said third set of input terminals and having a match output;
a fixed array of logic devices having a plurality of chip select output terminals and a match output terminal, said fixed array having a plurality of inputs, including separate ones of said inputs connected to each of said individual comparator outputs, separate ones of said inputs connected to each of said non-programmable decoder outputs and connected to said match outputs.

19. A programmable chip select decoder as claimed in claim 18 wherein each of said comparators can be individually programmed to accept a selected one of high true and low true input signals.

20. A programmable chip select decoder as claimed in claim 19 wherein said comparators are fuse programmable and achieve extremely low power operation by providing a blown fuse in every comparator during normal programmed operation.

21. A programmable chip select decoder for providing a communication link between a processor and a peripheral in response to a command from said processor, said decoder incorporating an improved device architecture comprising:
means for receiving a plurality of address bits from a multiplex bus;
means for providing a first set of said address bits, through a transparent input latch means, to a first plurality of parallel programmable comparators;
means for providing the remainder of said address bits, through said transparent input latch means, to a fixed decoder;
means for providing the outputs of said comparators and said fixed decoder to a fixed AND array having as its output a chip select signal.

22. A programmable chip select decoder for providing a communication link between a processor and a peripheral in response to a command from said processor, said decoder incorporating an improved device architecture comprising:
means for receiving a plurality of address bits from a multiplex bus including an input terminal to which is provided a control signal from said processor said control signal providing timing information for use in demultiplexing address/data signal;
means for providing a first set of said address bits, through a transparent input latch means, to a first plurality of parallel programmable comparators;
means for providing a second set of said address bits, through said transparent input latch means, to a fixed decoder;
means for providing the outputs of said comparators and said fixed decoder to a fixed AND array having as its output a chip select signal.

23. A programmable chip select decoder as claimed in claim 22 wherein:
said first plurality of programmable comparators consists of first and second one bit fuse programmable comparators,
said first one bit fuse programmable comparator having an output connected to an input of each of a first group of logical AND gates, and
said second one bit fuse programmable comparator having an output connected to an input of each of a second group of logical AND gates.

24. A programmable chip select decoder as claimed in claim 23 wherein said fixed AND array consists of said first and second groups of logical AND gates, each of said AND gates including inputs connected to:
the output of only one of said comparators of said first plurality of programmable comparators, and
the output of said fixed decoder.

25. A programmable chip select decoder as claimed in claim 24 further comprising:
means for providing a third set of said address bits to a programmable match comparator, said programmable match comparator providing a logical AND function, on a bit by bit basis, to provide a true match comparator output only when each bit in said third set of address bits corresponds to an associated bit code programmed into said match comparator.

26. A programmable chip select decoder as claimed in claim 25 wherein said output of said match comparator is provided to an input of each AND gate of said fixed AND array and is further provided to a match output terminal of said programmable chip select decoder.

27. A programmable chip select decoder as claimed in claim 26 further comprising:
an input select terminal for receiving a select signal, said select signal being provided to an input of each of said AND gates of said fixed AND array.

28. A programmable chip select decoder as claimed in claim 27 wherein said select signal provides timing control for the output of said fixed AND array to insure that no chip select output signal is provided during periods when the address signal is in transition.

29. A programmable chip select decoder comprising:
a low bank select terminal,
a high bank select terminal,
a two-terminal non-programmable input portion,
a seven-terminal programmable input portion,
a first programmable comparator for providing a true output as a low bank select output when an address bit provided to said low bank select terminal has a low bank select value;
a second programmable comparator for providing a true output as a high bank select output when an address bit provided to said high bank select terminal has a high bank select value;
a two-to-four decoder for providing a true output as a decoder output on one of four decoder output lines in response to address bits provided to said two-terminal non-programmable input portion;
a seven bit programmable comparator means for providing a true output as a match output when each of seven address bits provided to said seven-terminal programmable input portion correspond with a seven bit code programmed into said seven bit programmable comparator means;
a fixed array of eight AND gates, each including three inputs, said array comprising;
a first set of four of said AND gates each having as a first one of its inputs said low bank select output and having as a second one of its inputs said match output and having as a third one of its inputs a separate one of said four decoder outputs, and
a second set of four of said AND gates, exclusive of said first set of four of said AND gates, each having as a first one of its inputs said high bank select output and having as a second one of its inputs said match output and having as a third one of its inputs a separate one of said four decoder outputs;
an array of eight output terminals, corresponding on a one-to-one basis with outputs of said AND gates in said fixed array of eight AND gates, and
a match output terminal to which is provided said match output.

30. A programmable chip select decoder as claimed in claim 29 further comprising:
a fast output select terminal to which is provided a one bit output select signal having a true value only when there is not a transition condition for the address signal, wherein said output select signal is provided to a fourth input of each of said eight AND gates in said fixed array of eight AND gates.

31. A programmable chip select decoder as claimed in claim 29 further comprising:
transparent input latch means connected to said low bank select terminal, said high bank select terminal, said two-terminal non-programmable input portion and said seven-terminal programmable input portion.

32. A programmable chip select decoder as claimed in claim 31 further comprising:
a fast output select terminal to which is provided a one bit output select signal having a true value only when there is not a transition condition for the address signal, wherein said output select signal is provided to a fourth input of each of said eight AND gates in said fixed array of eight AND gates.

* * * * *